United States Patent
Uchiyama et al.

(10) Patent No.: US 6,876,030 B2
(45) Date of Patent: Apr. 5, 2005

(54) SEMICONDUCTOR MEMORY DEVICE

(75) Inventors: Kiyoshi Uchiyama, Colorado Springs, CO (US); Yasuhiro Shimada, Kyoto (JP); Koji Arita, Osaka (JP); Tatsuo Otsuki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/956,556

(22) Filed: Sep. 20, 2001

(65) Prior Publication Data

US 2002/0036314 A1 Mar. 28, 2002

(30) Foreign Application Priority Data

Sep. 22, 2000 (JP) ..................................... 2000-288373

(51) Int. Cl.⁷ .............................................. H01L 29/76
(52) U.S. Cl. ...................................... 257/314; 257/315
(58) Field of Search ............................... 257/324, 325, 257/326, 314, 315, 316, 317, 318, 319, 320, 321, 322

(56) References Cited

U.S. PATENT DOCUMENTS

| | | | | |
|---|---|---|---|---|
| 5,378,905 A | * | 1/1995 | Nakamura ................... | 257/213 |
| 5,498,888 A | * | 3/1996 | Ozawa ........................ | 257/295 |
| 5,998,819 A | * | 12/1999 | Yokoyama et al. ......... | 257/295 |
| 6,067,244 A | * | 5/2000 | Ma et al. .................... | 365/145 |
| 6,107,656 A | * | 8/2000 | Igarashi ....................... | 257/295 |

(Continued)

FOREIGN PATENT DOCUMENTS

| | | |
|---|---|---|
| DE | 199 28 280 A 1 | 1/2000 |
| EP | 0 688 046 A2 | 12/1995 |
| EP | 0 797 244 A2 | 9/1997 |
| JP | 49-079434 A | 7/1974 |
| JP | 05-090599 | 4/1993 |
| JP | 05-090599 A * | 4/1993 ......... H01L/29/788 |
| JP | 405129625 A * | 5/1993 ................ 257/315 |
| JP | 07-099257 | 4/1995 |
| JP | 09-260612 | 10/1997 |
| JP | 10-294432 A | 11/1998 |
| JP | 11-177037 A | 7/1999 |
| JP | 2003-510848 | 3/2003 |
| WO | WO 92/12518 | 7/1992 |
| WO | WO 99/19878 | 4/1999 |

OTHER PUBLICATIONS

Patent Abstract of Japan vol. 1996, No. 11, Nov. 29, 1996 & JP 08–181288 A.
Patent Abstract of Japan vol. 1998, No. 11, Sep. 30, 1998 & JP 10–163436 A.
Patent Abstract of Japan vol. 1999, No. 12, Oct. 29, 1999 & JP 11–177037.
European Search Report Dated May 3, 2004.
"An analysis of effects of device structures on retention characteristics in MFIS structures", by M. Okuyama et al., Applications of Ferroelectrics, 2000. ISAF 2000. Proceedings of the 2000 12$^{th}$ IEEE Int. Symposium, pp. 337–340, vol. 1.
"Characteristics of Pt/SrTiO$_3$/Pb (Zr$_{0.52}$, Ti$_{0.48}$) O$_3$/SrTiO$_3$/Si ferroelectric gate oxide structure", by Dong SuK Shin et al., Thiin Solid Films, 354(1999), pp. 251–255.

*Primary Examiner*—Eddie Lee
*Assistant Examiner*—Douglas W. Owens
(74) *Attorney, Agent, or Firm*—Nixon Peabody LLP; Donald R. Studebaker

(57) ABSTRACT

A semiconductor memory device includes a field-effect transistor with a gate electrode that has been formed over a semiconductor substrate with a ferroelectric layer interposed between the electrode and the substrate. The device includes a first insulating layer, which is insulated against a leakage current more fully than the ferroelectric layer, between the ferroelectric layer and the gate electrode.

13 Claims, 2 Drawing Sheets

U.S. PATENT DOCUMENTS

| | | | |
|---|---|---|---|
| 6,229,166 B1 * | 5/2001 | Kim et al. | 257/295 |
| 6,297,527 B1 * | 10/2001 | Agarwal et al. | 257/306 |
| 6,310,373 B1 * | 10/2001 | Azuma et al. | 257/295 |
| 6,316,800 B1 * | 11/2001 | Al-Shareef et al. | 257/296 |
| 6,368,517 B1 * | 4/2002 | Hwang et al. | 216/67 |
| 6,396,092 B1 * | 5/2002 | Takatani et al. | 257/295 |
| 6,410,397 B1 * | 6/2002 | Ochiai et al. | 438/381 |
| 6,461,982 B2 * | 10/2002 | DeBoer et al. | 438/778 |
| 6,476,432 B1 * | 11/2002 | Basceri et al. | 257/296 |
| 6,483,135 B1 * | 11/2002 | Mizuta et al. | 257/283 |
| 6,483,167 B1 * | 11/2002 | Nabatame et al. | 257/532 |
| 6,486,020 B1 * | 11/2002 | Thakur et al. | 438/240 |
| 2001/0040249 A1 | 11/2001 | Jung | |
| 2002/0043677 A1 | 4/2002 | Jung | |
| 2002/0074601 A1 * | 6/2002 | Fox et al. | 257/350 |

* cited by examiner

SEMICONDUCTOR MEMORY DEVICE

BACKGROUND OF THE INVENTION

The present invention relates to a semiconductor memory device including a field-effect transistor with a gate electrode that has been formed over a semiconductor substrate with a ferroelectric layer interposed between the electrode and the substrate.

Recently, ferroelectric random-access memories (which will be herein referred to as "FeRAMs") for use in IC cards or portable electronic units have been developed by semiconductor manufacturers. FeRAMs are nonvolatile memories, i.e., some contents stored thereon are not lost even when power is removed, and yet can operate almost as fast as DRAMs.

Most of the FeRAMs currently under development have either a two-transistor two-capacitor (2T2C) memory cell structure or a one-transistor one-capacitor (1T1C) memory cell structure. Therefore, in order to downsize FeRAMs, advanced patterning technology, including a technique of realizing a stereoscopic capacitor structure, is required. The difficulty in downsizing a memory is a common problem for both FeRAMs and DRAMs alike, and should constitute a serious obstacle to further increasing the density or capacity of a memory in the near future.

Meanwhile, as another circuit configuration for FeRAMs, a ferroelectric FET memory (which will be herein referred to as an "FeFET memory") comprising a field-effect transistor, in which part of the gate insulating layer is a ferroelectric layer, has also been under research and development. Since the FeFET memory includes no capacitors, it is possible to avoid the downsizing problem. In other words, the FeFET memory can not only be a nonvolatile, high-speed-operating memory just like the known FeRAM but also realizes high density. Thus, the memory is considered to have ultimate characteristics for a semiconductor memory.

A cell structure for a known semiconductor memory device, specifically, a cell structure for an FeFET memory, will be described with reference to FIG. 5.

As shown in FIG. 5, insulating layer 104, floating gate 105, ferroelectric layer 106 and gate electrode 107 are stacked in this order on a semiconductor substrate 101 in which a source region 102 and a drain region 103 are defined. In this case, the floating gate 105 and the gate electrode 107 are usually made of metal(s), and the FeFET memory structure shown in FIG. 5 is called an "MFMIS structure", in which MFMIS is the acronym for Metal (gate electrode 107), Ferroelectric (ferroelectric layer 106), Metal (floating gate 105), Insulator (insulating layer 104) and Semiconductor (semiconductor substrate 101).

As for a memory cell with the structure shown in FIG. 5, the voltage applied to the gate electrode 107 (which will be herein referred to as a "gate voltage") generates a potential difference between both ends of the ferroelectric layer 106, thus producing polarization in the ferroelectric layer 106. The conductance between the source region 102 and the drain region 103 changes depending on whether the direction of the polarization is upward (toward the gate electrode 107) or downward (toward the semiconductor substrate 101). Thus, even when a gate voltage of the same level is applied to the gate electrode 107, different amounts of currents flow between the source region 102 and the drain region 103, thus realizing a memory function.

Furthermore, since the ferroelectric layer 106 retains the same polarization direction even when the gate voltage applied is removed from the layer, the memory function includes a nonvolatile characteristic as well.

In the known FeFET memory cell structure, however, even when the gate voltage is removed, a potential generates in the floating gate 105 due to the existence of the polarization in the ferroelectric layer 106. Thus, a leakage current flows from the floating gate 105 into the semiconductor substrate 101 and the gate electrode 107 through the insulating layer 104 and the ferroelectric layer 106 respectively, resulting in non-negligible decrease of effective charges stored in the floating gate 105.

In this case, when silicon dioxide is used for a material for the insulating layer 104, the amount of leakage current flowing though the insulating layer 104 substantially stays within a negligible range, compared to that of the leakage current flowing through the ferroelectric layer 106. However, it is difficult to realize a good leakage current characteristic for the ferroelectric layer 106 in the present circumstances. Therefore, as for FeFET memory cells currently available, the memory retention characteristic (which will be herein referred to as a "retention characteristic") is at most ten days mainly because of the leakage current flowing into the gate electrode 107 by way of the ferroelectric layer 106. That is to say, the 10 year retention characteristic, which is essential for commercial applications, has not been fulfilled yet.

SUMMARY OF THE INVENTION

It is therefore an object of the present invention to reduce the amount of leakage current flowing from the ferroelectric layer of an FeFET memory toward the gate electrode thereof and thereby improve the retention characteristics of the memory greatly.

In order to achieve this object, a first semiconductor memory device according to this invention is supposed to include a field-effect transistor with a gate electrode that has been formed over a semiconductor substrate with a ferroelectric layer interposed between the electrode and the substrate. In this device, a first insulating layer, which is insulated against a leakage current more fully than the ferroelectric layer, is formed between the ferroelectric layer and the gate electrode.

In the first inventive memory device, the first insulating layer that is insulated against a leakage current more fully than the ferroelectric layer exists between the ferroelectric layer and the gate electrode. Thus, the leakage current flowing from the ferroelectric layer toward the gate electrode can be reduced considerably, thus improving the retention characteristics of the FeFET memory greatly.

In one embodiment of the invention, the first memory device may further include a second insulating layer, which is formed between the ferroelectric layer and the semiconductor substrate and insulated against a leakage current more fully than the ferroelectric layer.

Then, the leakage current flowing from the ferroelectric layer toward the semiconductor substrate can also be reduced, thus further improving the retention characteristics of the FeFET memory.

In another embodiment of the invention, the first insulating layer may include an oxide layer containing strontium and tantalum.

Then, the voltage applied to the ferroelectric layer can be kept higher compared to a situation where a gate voltage of the same level is applied with another insulator with good insulating properties (e.g., silicon dioxide) used for the first insulating layer in the same device structure. This is because an oxide containing strontium and tantalum has good insulating properties as well as a high dielectric constant.

In still another embodiment, the ferroelectric layer may be made of a bismuth layered compound and the first insulating layer may include an oxide layer containing strontium and tantalum.

Then, even when bismuth contained in the ferroelectric layer diffuses around the interface between the ferroelectric layer and the first insulating layer, strontium bismuth tantalate ($SrBi_2Ta_2O_9$; which will be herein referred to as "SBT"), which is a typical ferroelectric bismuth layered compound, is produced in the interface. Thus, the resultant ferroelectric properties do not deteriorate. Specifically, where SBT or a compound derived from SBT (which will be herein referred to as a "derivative compound") is used for the ferroelectric layer, the ferroelectric properties do not deteriorate due to the interdiffusion of the constituents between the ferroelectric and first insulating layers.

In yet another embodiment, the ferroelectric layer may be made of lead zirconate titanate and the first insulating layer may include an oxide layer containing lead zirconate titanate.

Then, even when lead contained in the ferroelectric layer diffuses around the interface between the ferroelectric layer and the first insulating layer, a derivative compound of lead zirconate titanate is produced in the interface. Thus, the ferroelectric properties do not deteriorate due to the interdiffusion of the constituents between the ferroelectric layer and the first insulating layer.

To achieve the above-mentioned object, a second semiconductor memory device according to this invention is supposed to include a field-effect transistor including a gate electrode that has been formed over a semiconductor substrate with a ferroelectric layer interposed between the electrode and the substrate. In this device, the ferroelectric layer is covered with an insulating layer, which is insulated against a leakage current more fully than the ferroelectric layer.

In the second inventive memory device, the ferroelectric layer is covered with an insulating layer, which is insulated against a leakage current more fully than the ferroelectric layer. Thus, the amount of leakage current flowing from the ferroelectric layer toward the gate electrode or from the ferroelectric layer in all directions can be reduced considerably, thus improving the retention characteristics of the FeFET memory greatly.

In one embodiment of the invention, the insulating layer may include an oxide layer containing strontium and tantalum.

Then, the voltage applied to the ferroelectric layer can be kept higher compared to a situation where a gate voltage of the same level is applied with another insulator with good insulating properties (e.g., silicon dioxide) used for the insulating layer in the same device structure. This is because an oxide containing strontium and tantalum has good insulating properties as well as a high dielectric constant.

In another embodiment of this invention, the ferroelectric layer may be made of a bismuth layered compound and the insulating layer may include an oxide layer containing strontium and tantalum.

Then, even when bismuth contained in the ferroelectric layer diffuses around the interface between the ferroelectric layer and the insulating layer, SBT, which is a typical ferroelectric bismuth layered compound, is produced in the interface. Thus, the resultant ferroelectric properties do not deteriorate. Specifically, where SBT or a derivative compound thereof is used for the ferroelectric layer, the ferroelectric properties do not deteriorate due to the interdiffusion of the constituents between the ferroelectric and insulating layers.

In still another embodiment, the ferroelectric layer may be made of lead zirconate titanate and the insulating layer may include an oxide layer containing lead zirconate titanate.

Then, even when lead contained in the ferroelectric layer diffuses around the interface between the ferroelectric layer and the insulating layer, a derivative compound of lead zirconate titanate is produced in the interface. Thus, the ferroelectric properties do not deteriorate due to the interdiffusion of the constituents between the ferroelectric and insulating layers.

DESCRIPTION OF THE PREFERRED EMBODIMENTS

Embodiment 1

Hereinafter, a semiconductor memory device according to a first embodiment of the present invention will be described with reference to the accompanying drawings.

Figure 1:
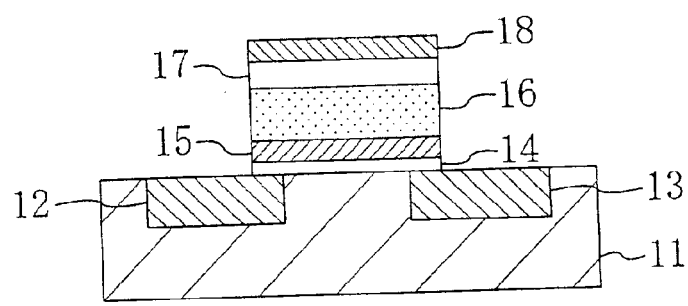
FIG. 1 is a cross-sectional view showing a cell structure for a semiconductor memory device according to a first embodiment of the present invention.

FIG. 1 is a cross-sectional view showing a cell structure for a semiconductor memory device according to the first embodiment, specifically, a cell structure for an FeFET memory.

As shown in FIG. 1, lower insulating layer 14, floating gate 15, ferroelectric layer 16, upper insulating layer 17 and gate electrode 18 are stacked in this order on a semiconductor substrate 11 in which source and drain regions 12 and 13 are defined. In this structure, the lower insulating layer 14 and the upper insulating layer 17 are insulated against leakage current more fully than the ferroelectric layer 16.

In the memory cell of the embodiment shown in FIG. 1, a voltage is applied between the gate electrode 18 and the semiconductor substrate 11 so that one of the gate electrode 18 and the semiconductor substrate 11 is at a positive or negative potential level with respect to the other. Thus, the polarization exiting in the ferroelectric layer 16 can be oriented toward the gate electrode 18 or the semiconductor substrate 11.

In this case, the voltage applied to the ferroelectric layer 16 is determined by the structure in which capacitances formed by the lower insulating layer 14, ferroelectric layer 16 and upper insulating layer 17 are connected in series together. Specifically, the voltage applied between the gate electrode 18 and the semiconductor substrate 11 is distributed among the lower insulating layer 14, ferroelectric layer 16 and upper insulating layer 17 according to the reciprocals of their respective capacitances. Thus, the floating gate 15 is not at zero potential level normally when some contents are stored in the memory, while the gate electrode 18 is at zero potential level when the power is removed from the memory. As a result, a potential difference generates between the bottom of the ferroelectric layer 16 and the top of the upper insulating layer 17.

In this embodiment, however, the upper insulating layer 17, which is insulated against leakage current more fully than the ferroelectric layer 16, is interposed between the floating gate 15 and the gate electrode 18. Accordingly, it is possible to prevent the leakage current from flowing from the floating gate 15 toward the gate electrode 18. Therefore, the charges created in the floating gate 15 can be retained for a long time, thus realizing an FeFET memory having a good retention characteristic.

In this embodiment, the lower insulating layer 14, which is insulated against leakage current more fully than the ferroelectric layer 16, is interposed between the floating gate 15 and the semiconductor substrate 11. Accordingly, the leakage current, flowing from the floating gate 15 toward the semiconductor substrate 11, can also be reduced. Therefore, the retention characteristic of the FeFET memory is further improvable.

That is to say, the semiconductor memory device of this embodiment realizes excellent characteristics, which none of the known semiconductor memory devices could realize. The memory cell structure of this memory device consists of the gate electrode 18 (Metal), upper insulating layer 17 (Insulator), ferroelectric layer 16 (Ferroelectric), floating gate 15 (Metal), lower insulating layer 14 (Insulator) and semiconductor substrate 11 (Semiconductor) in the descending order. Thus, the memory cell structure of this embodiment is named an "MIFMIS structure" according to the known nomenclature for the field of FeFET memories.

Figure 5:
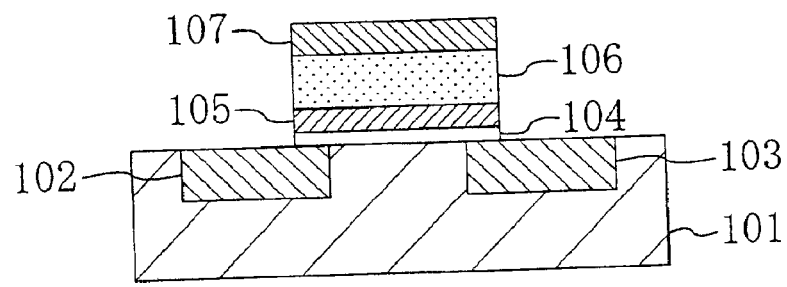
FIG. 5 is a cross-sectional view showing a cell structure for a known semiconductor memory device.

Generally speaking, a high voltage is preferably applied to the ferroelectric layer 16 in writing data on a memory. In contrast, in the inventive MIFMIS structure, the voltages applied to the lower insulating layer 14 and the upper insulating layer 17 may be lower than the voltage applied to the insulating layer (e.g. the insulating layer 104 shown in FIG. 5) of the known FeFET memory cell structure (i.e., a normal MFMIS structure in which no insulator is interposed between the gate electrode and the ferroelectric layer). Thus, the lower insulating layer 14 and the upper insulating layer 17 may be thinner than the insulating layer of the known MFMIS structure. Therefore, when the capacitances formed by the lower insulating layer 14 and the upper insulating layer 17 are connected in series together, the total capacitance (the reciprocal of the sum of the reciprocals of those capacitances) can be substantially equal to the capacitance formed by the insulating layer of the normal MFMIS structure. As a result, the voltage applied to the ferroelectric layer 16 can be substantially equal to the voltage applied to the ferroelectric layer of the normal MFMIS structure.

In this embodiment, silicon dioxide is preferably used for the lower insulating layer 14 and an oxide containing strontium and tantalum is preferably used for the upper insulating layer 17. The reason is as follows. In general, an oxide containing strontium and tantalum has a high dielectric constant of 100 or more, which is close to that of the ferroelectric layer 16. Meanwhile, silicon dioxide has a low dielectric constant of approximately 5. Therefore, when a voltage is applied to the gate electrode 18 to write data on the memory, the potential at the interface between the ferroelectric layer 16 and the upper insulating layer 17 is close to the gate potential. As a result, a high voltage can be effectively applied to the ferroelectric layer 16. Since silicon dioxide is used for the lower insulating layer 14, the lower insulating layer 14 and the floating gate 15 do not have to be formed by a ferroelectric forming process but may be formed by a process normally used for forming a flash memory (e.g. a normal silicon process). Therefore, it is possible to form high-quality floating gate 15 and lower insulating layer 14 with good insulating properties. Moreover, the ferroelectric layer 16 and the upper insulating layer 17 are formed on the high-quality floating gate 15. Accordingly, the ferroelectric layer 16 and the upper insulating layer 17 can exhibit excellent crystallinity and electrical insulating properties.

Preferably, in this embodiment, a bismuth layered compound is used for the ferroelectric layer 16 and an oxide containing strontium and tantalum is used for the upper insulating layer 17. The reason is as follows. When bismuth contained in the ferroelectric layer 16 diffuses around the interface between the ferroelectric layer 16 and the upper insulating layer 17, strontium bismuth tantalate (SBT) having ferroelectric properties is produced in the interface, thus causing no deterioration in the resultant ferroelectric properties. Specifically, where SBT or a derivative compound thereof is used for the ferroelectric layer 16, a constituent (strontium or tantalum) of the upper insulating layer 17 is one of the constituents of the ferroelectric layer 16. Therefore, even when the constituents of the layers 16 and 17 interdiffuse between themselves, the ferroelectric properties of the ferroelectric layer 16 or the insulating properties of the upper insulating layer 17 do not deteriorate due to the interdiffusion.

Further, in this embodiment, lead zirconate titanate is preferably used for the ferroelectric layer 16 and an oxide containing lead zirconate titanate is preferably used for the upper insulating layer 17. The reason is as follows. When lead contained in the ferroelectric layer 16 diffuses around the interface between the ferroelectric layer 16 and the upper insulating layer 17, a derivative compound of lead zirconate titanate is produced in the interface. Thus, the ferroelectric properties do not deteriorate due to the interdiffusion of the constituents between the ferroelectric and upper insulating layers 16 and 17.

Also, in this embodiment, the upper insulating layer 17 may be made of a single material or two or more types of insulators in any arbitrary combination.

For example, the upper insulating layer 17 may be either a single oxide layer containing strontium and tantalum or a mutilayer structure including the oxide layer and an additional layer of another insulator. Alternatively, the upper insulating layer 17 may be either a single oxide layer containing lead zirconate titanate or a multilayer structure including the oxide layer and an additional layer of another insulator.

MODIFIED EXAMPLE 1 OF EMBODIMENT 1

Hereinafter, a semiconductor memory device according to a first modified example of the first embodiment will be described with reference to the accompanying drawings.

Figure 2:
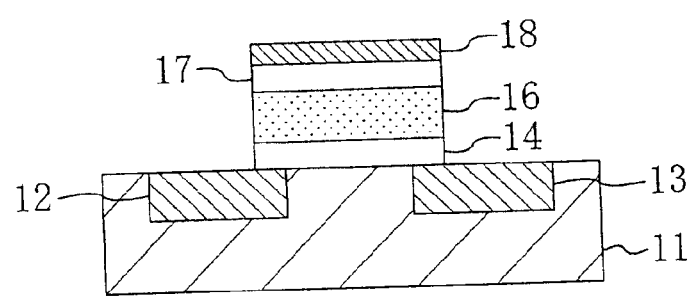
FIG. 2 is a cross-sectional view showing a cell structure for a semiconductor memory device according to a first modified example of the first embodiment.

FIG. 2 is a cross-sectional view showing a cell structure for a semiconductor memory device according to the first modified example, specifically, a cell structure for an FeFET memory. In FIG. 2, each member also shown in FIG. 1 is identified by the same reference numeral and the description thereof will be omitted herein.

The first embodiment relates to an FeFET memory (see FIG. 1) including the floating gate 15, while the first modified example of the first embodiment relates to an FeFET memory including no floating gate 15. That is to say, the only difference between the first embodiment and the first modified example is that the floating gate 15 is not included in the first modified example shown in FIG. 2.

In this first modified example of the first embodiment, the voltage applied to the ferroelectric layer 16 is also determined by the structure in which capacitances formed by the lower insulating layer 14, ferroelectric layer 16 and upper insulating layer 17 are connected in series together as in the first embodiment. Specifically, the voltage applied between the gate electrode 18 and the semiconductor substrate 11 is distributed among the lower insulating layer 14, ferroelectric layer 16 and upper insulating layer 17 according to the reciprocals of their respective capacitances. Thus, the interface between the lower insulating layer 14 and the ferroelectric layer 16 is not at zero potential level normally when some contents are stored in the memory, while the gate electrode 18 is at zero potential level when the power is removed from the memory. As a result, a potential difference generates between the bottom of the ferroelectric layer 16 and the top of the upper insulating layer 17.

In this modified example, however, the upper insulating layer 17, which is insulated against leakage current more fully than the ferroelectric layer 16, is interposed between the ferroelectric layer 16 and the gate electrode 18. Accordingly, it is possible to prevent the leakage current from flowing from the ferroelectric layer 16 toward the gate electrode 18, thus realizing an FeFET memory having a good retention characteristic.

In this modified example, the lower insulating layer 14, which is insulated against leakage current more fully than the ferroelectric layer 16, is interposed between the ferroelectric layer 16 and the semiconductor substrate 11. Accordingly, the leakage current, flowing from the ferroelectric layer 16 toward the semiconductor substrate 11, can also be reduced. Therefore, the retention characteristic of the FeFET memory is further improvable.

MODIFIED EXAMPLE 2 OF EMBODIMENT 1

Hereinafter, a semiconductor memory device according to a second modified example of the first embodiment will be described with reference to the accompanying drawings.

Figure 3:
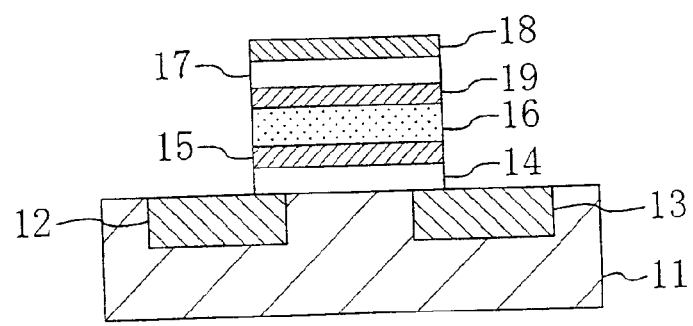
FIG. 3 is a cross-sectional view showing a cell structure f or a semiconductor memory device according to a second modified example of the first embodiment.

FIG. 3 is a cross-sectional view showing a cell structure for a semiconductor memory device according to the second modified example, specifically, a cell structure for an FeFET memory. In FIG. 3, each member also shown in FIG. 1 is identified by the same reference numeral and the description thereof will be omitted herein.

The first embodiment relates to an FeFET memory (see FIG. 1) including one floating gate 15, while the second modified example of the first embodiment relates to an FeFET memory including two floating gates. That is to say, the only difference between the first embodiment and the second modified example is that an upper floating gate 19 is formed between the ferroelectric layer 16 and the upper insulating layer 17, in addition to the floating gate 15, in the second modified example as shown in FIG. 3.

In this modified example, the following effects are achieved in addition to those of the first embodiment. Specifically, the upper floating gate 19 is formed between the ferroelectric layer 16 and the upper insulating layer 17. Accordingly, it is possible to prevent the constituents of the ferroelectric and upper insulating layers 16 and 17 from interdiffusing between themselves and thereby suppress the deterioration in ferroelectric properties. In addition, an electric field can be uniformly applied to the ferroelectric layer 16 as well.

Embodiment 2

Hereinafter, a semiconductor memory device according to a second embodiment of the present invention will be described with reference to the accompanying drawings.

Figure 4:
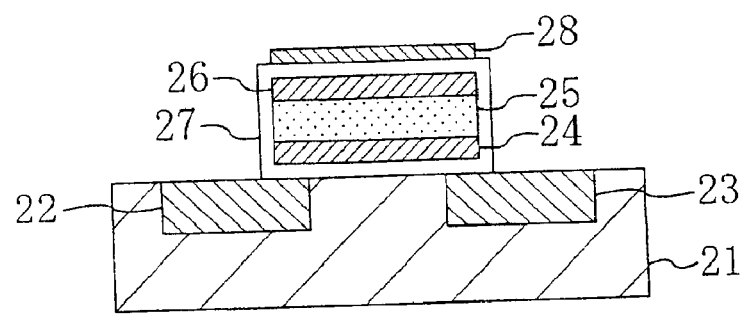
FIG. 4 is a cross-sectional view showing a cell structure for a semiconductor memory device according to a second embodiment of the present invention.

FIG. 4 is a cross-sectional view showing a cell structure for a semiconductor memory device according to the second embodiment, specifically, a cell structure for an FeFET memory.

As shown in FIG. 4, a multilayer structure, which consists of lower floating gate 24, ferroelectric layer 25 and upper floating gate 26 that have been stacked in this order, is formed on a semiconductor substrate 21 in which source and drain regions 22 and 23 are defined. The multilayer structure is covered with an insulating layer 27. That is to say, the upper, lower and side faces of the multilayer structure are covered with the insulating layer 27. A gate electrode 28 is formed over the multilayer structure, or, the upper floating layer 26 with the insulating layer 27 interposed between them. In this structure, the insulating layer 27 is insulated against leakage current more fully than the ferroelectric layer 25.

In this embodiment, the ferroelectric layer 25 is sandwiched between the lower floating gate 24 closer to the semiconductor substrate 21 and the upper floating gate 26 closer to the gate electrode 28. In addition, the multilayer structure, which consists of the lower floating gate 24, ferroelectric layer 25 and upper floating gate 26, is covered with the insulating layer 27 that is insulated against leakage current more fully than the ferroelectric layer 25. Accordingly, the amount of leakage current flowing from the upper floating gate 26 toward the gate electrode 28 or from the lower floating gate 24 toward the gate electrode 28 by way of the ferroelectric layer 25 can be reduced greatly. It is also possible to greatly reduce the amount of leakage current flowing from the lower floating gate 24 toward the semiconductor substrate 21 or from the upper floating gate 26 toward the semiconductor substrate 21 by way of the ferroelectric layer 25. Further, the leakage current flowing from the side faces of the ferroelectric layer 25 can also be reduced. That is to say, the leakage currents flowing from the ferroelectric layer 25 in all directions can be reduced considerably, thus improving the retention characteristics of the FeFET memory greatly.

In this embodiment, two floating gates, namely, the upper floating gate 26 and the lower floating gate 24, are formed. Alternatively, only one or no floating gate may be formed instead.

In this embodiment, an oxide containing strontium and tantalum is preferably used for the insulating layer 27. An oxide containing strontium and tantalum has good insulating properties as well as a high dielectric constant. Thus, the voltage applied to the ferroelectric layer 25 can be kept higher compared to a situation where a gate voltage of the same level is applied with another insulator with good insulating properties (e.g., silicon dioxide) used for the insulating layer 27 in the same device structure.

Preferably, in this embodiment, a bismuth layered compound is used for the ferroelectric layer 25 and an oxide containing strontium and tantalum is used for the insulating layer 27. The reason is as follows. Suppose the upper floating gate 26 or the lower floating gate 24 is not formed. In that case, even when bismuth contained in the ferroelectric layer 25 diffuses around the interface between the ferroelectric layer 25 and the insulating layer 27, SBT, which is a typical ferroelectric bismuth layered compound, is produced in the interface. Thus, the resultant ferroelectric properties do not deteriorate. Specifically, where SBT or a derivative compound thereof is used for the ferroelectric layer 25, the ferroelectric properties do not deteriorate due to the interdiffusion of the constituents between the ferroelectric and insulating layers 25 and 27.

Further, in this embodiment, lead zirconate titanate is preferably used for the ferroelectric layer 25 and an oxide containing lead zirconate titanate is preferably used for the insulating layer 27. The reason is as follows. Suppose the upper floating gate 26 or the lower floating gate 24 is not formed. In that case, even when lead contained in the ferroelectric layer 25 diffuses around the interface between the ferroelectric layer 25 and the insulating layer 27, a derivative compound of lead zirconate titanate is produced in the interface. Thus, the ferroelectric properties do not deteriorate due to the interdiffusion of the constituents between the ferroelectric and insulating layers 25 and 27.

Also, in this embodiment, the insulating layer 27 may be made of a single material or two or more types of insulators in any arbitrary combination.

For example, the insulating layer 27 may be either a single oxide layer containing strontium and tantalum or a mutilayer structure including the oxide layer and an additional layer of another insulator. Alternatively, the insulating layer 27 may be either a single oxide layer containing lead zirconate titanate or a multilayer structure including the oxide layer and an additional layer of another insulator.

What is claimed is:

1. A ferroelectric device comprising a ferroelectric material having remnant polarization formed on a semiconductor substrate, a conductive material formed on the ferroelectric material, and a first insulating layer interposed between the ferroelectric material and the conductive material, wherein the first insulating layer is composed of an oxide containing at least lead, zirconium, and titanium, and prevents a leakage current flowing from the ferroelectric material to the conductive material, and wherein the ferroelectric material is made of lead zirconate titanate.

2. A ferroelectric device comprising a ferroelectric material having remnant polarization formed on a semiconductor substrate, a conductive material formed on the ferroelectric material, and an insulating layer covering the ferroelectric material, wherein, the insulating layer is composed of an oxide containing at least lead, zirconium and titanium, and prevents a leakage current flowing from the ferroelectric material to the conductive material, and wherein, the ferroelectric material is made of lead zirconate titanate.

3. A semiconductor memory device using a field-effect transistor including a ferroelectric layer formed on a semiconductor substrate and a gate electrode formed on the ferroelectric layer, wherein an insulating layer for preventing a leakage current is formed between the ferroelectric layer and the gate electrode, and wherein the insulating layer has a lower conductivity than the ferroelectric layer.

4. The device of claim 3, wherein another insulating layer for preventing a leakage current is formed between the ferroelectric layer and the semiconductor substrate.

5. The device of claim 3, wherein the ferroelectric layer is made of a bismuth layered compound.

6. The device of claim 3, wherein the ferroelectric layer is made of lead zirconate titanate, and wherein the insulating layer is composed of an oxide containing at least lead, zirconium and titanium.

7. The device of claim 3, wherein the insulating layer is composed of an oxide containing strontium and tantalum.

8. The device of claim 3, wherein a floating gate is provided between the ferroelectric layer and the insulating layer.

9. A semiconductor memory device using a field-effect transistor including a ferroelectric layer formed on a semiconductor substrate and a gate electrode formed on the ferroelectric layer, wherein the ferroelectric layer is covered with an insulating layer for preventing a leakage current, and wherein the insulating layer has a lower conductivity than the ferroelectric layer.

10. The device of claim 9, wherein the ferroelectric layer is made of a bismuth layered compound.

11. The device of claim 9, wherein the ferroelectric layer is made of lead zirconate titanate, and wherein the insulating layer is composed of an oxide containing at least lead, zirconium and titanium.

12. The device of claim 9, wherein the insulating layer is composed of an oxide containing strontium and tantalum.

13. The device of claim 9, wherein a floating gate is provided between the ferroelectric layer and the insulating layer.

* * * * *